(12) United States Patent
Yamada et al.

(10) Patent No.: US 9,472,372 B2
(45) Date of Patent: Oct. 18, 2016

(54) CHARGED PARTICLE BEAM WRITING APPARATUS AND CHARGED PARTICLE BEAM WRITING METHOD

(71) Applicant: NuFlare Technology, Inc., Yokohama (JP)

(72) Inventors: Taku Yamada, Kanagawa (JP); Kaoru Tsuruta, Kanagawa (JP); Yasuyuki Taneda, Kanagawa (JP); Kenji Ohtoshi, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/798,797

(22) Filed: Jul. 14, 2015

(65) Prior Publication Data

US 2016/0020063 A1 Jan. 21, 2016

(30) Foreign Application Priority Data

Jul. 16, 2014 (JP) ................................ 2014-146352

(51) Int. Cl.
*G21K 5/04* (2006.01)
*H01J 37/147* (2006.01)
*H01J 37/141* (2006.01)
*H01J 37/04* (2006.01)

(52) U.S. Cl.
CPC .......... *H01J 37/1472* (2013.01); *H01J 37/045* (2013.01); *H01J 37/141* (2013.01); *H01J 2237/14* (2013.01); *H01J 2237/152* (2013.01)

(58) Field of Classification Search
USPC ................ 250/492.1, 492.2, 492.21, 492.22, 250/492.23, 492.3
See application file for complete search history.

(56) References Cited

U.S. PATENT DOCUMENTS 6,207,117 B1* 3/2001 Takamatsu et al. .......... 422/186
2014/0231668 A1* 8/2014 Yasuda ..................... 250/396 R

FOREIGN PATENT DOCUMENTS

JP 9-259811 10/1997
JP 9-293670 11/1997
JP 2013-168589 8/2013

* cited by examiner

*Primary Examiner* — Nicole Ippolito
(74) *Attorney, Agent, or Firm* — Oblon, McClelland, Maier & Neustadt, L.L.P.

(57) ABSTRACT

A charged particle beam writing apparatus includes a stage configured to mount a sample placed thereon; an electron optical column including a charged particle gun and deflector, wherein the charged particle gun is configured to emit a charged particle beam, and the deflector includes a plurality of deflecting electrodes configured to control a path of the charged particle beam; an ozone introducing mechanism configured to introduce ozone into the electron optical column; a first voltage supply unit configured to apply a deflection voltage to the plurality of deflecting electrodes to deflect the charged particle beam; and a second voltage supply unit configured to apply an identical negative DC voltage to the plurality of deflecting electrodes, wherein a negative voltage in which the deflection voltage and the negative DC voltage are added is applied to the plurality of deflecting electrodes while the sample is irradiated by the charged particle beam.

13 Claims, 7 Drawing Sheets

CHARGED PARTICLE BEAM WRITING APPARATUS AND CHARGED PARTICLE BEAM WRITING METHOD

CROSS-REFERENCE TO THE RELATED APPLICATION

The entire disclosure of the Japanese Patent Application No. 2014-146352, filed on Jul. 16, 2014 including specification, claims, drawings, and summary, on which the Convention priority of the present application is based, are incorporated herein in its entirety.

FIELD OF THE INVENTION

The present invention relates to a charged particle beam writing apparatus and a charged particle beam writing method.

BACKGROUND

Recently, with high integration and large capacity of a Large Scale Integration (LSI), a circuit dimension required for a semiconductor element becomes increasingly narrow.

Using an original image pattern (that is, a mask or a reticle, hereinafter collectively referred to as a mask) in which the circuit patterns are formed, a reduction projection exposure apparatus called a stepper exposes and transfers the pattern onto a wafer to form a circuit, thereby producing the semiconductor element. A charged particle beam writing apparatus using a charged particle beam, for example, the electron beam writing apparatus using an electron beam is used to produce the masks for transferring the fine circuit patterns onto the wafer. In the electron beam writing apparatus, as one example of a charged particle beam writing apparatus, because the electron used is a "wave" having an extremely short wavelength, resolution proportional to the wavelength of the beam can be enhanced, and the apparatus can be used to produce a highly accurate original pattern.

Japanese Laid-Open Patent Publication No. Hei 09-293670 (1997) discloses a variable shape electron beam writing apparatus used for electron beam lithography technique. Pattern writing data for such an apparatus is prepared by applying processing of the design data (CAD data) of a semiconductor integrated circuit designed by a CAD system, such as correcting the design data and dividing the graphic pattern included in the design data, as some examples of design data processing.

For example, the dividing process divides the graphic pattern into units of the maximum shot size, which is defined by the size of the electron beam. In addition, the apparatus sets the coordinate positions, size, and the radiation time of each divided shot. The pattern writing data is then produced so that shots are shaped accordance with the shape and size of the graphic pattern to be written. The pattern writing data is divided into pieces each corresponding to a strip-shaped frame (or main deflection region), and each frame is divided into pieces each corresponding to a sub-deflection region. That is, the pattern writing data for the entire semiconductor chip has a hierarchical data structure consisting of data of each of a plurality of strip-shaped frames in accordance with the size of the main reflection regions, and data of each of a plurality of units in accordance with the size of the sub-reflection regions (smaller in size than the main deflection regions) in the frame.

In the above-mentioned sub-deflection region, the electron beam is scanned at a higher speed than it is scanned over each main deflection region by the sub-deflector, which is one deflector included in an electron beam writing apparatus. The sub-deflection regions are generally the smallest units for a writing operation. When a writing operation is performed in each sub-deflection region, the shaping deflector forms shots of a size and shape in accordance with graphic patterns to be written. Specifically, in the electron beam writing apparatus, the electron beam emitted from the electron gun is shaped into a rectangular shape by a first aperture and then projected to a second aperture by the shaping deflector, resulting in a change in the shape and size of the beam. The electron beam is then deflected by the sub-deflector and the main deflector, and irradiated onto the mask mounted on the stage which is provided downstream of the electron gun.

It is well known that, when a writing operation is performed using the electron beam writing apparatus, a displacement of a position irradiated with the electron beam is generated, in accordance with the elapsed time and thus degrades the writing pattern, for example. The displacement of the position irradiated with the electron beam is called a beam drift. For example, the following phenomenon can be listed as a cause of the beam drift.

A trace amount of hydrocarbon ($C_nH_m$) gas is contained in the electron beam writing apparatus that has been substantially evacuated to allow formation of the electron beam. A component and a resist in the apparatus can be listed as an example of the gas generation source, and it is difficult to completely eliminate the gas from the gas generation source. The irradiating electron beam (or scattered electron) reacts with the gas to form contaminants on a surface of the component such as a deflector in the apparatus. When charges are accumulated on the contaminants, an electric field is generated by a difference in accumulated charge amount, and the irradiating electron beam is deflected by the electric field. As a result, the position irradiated with the electron beam is displaced.

For example, as disclosed in JP 09-259811 A, a method for cleaning the electron beam writing apparatus using ozone ($O_3$) is well known as a method for reducing the contaminants in the apparatus to solve the problem of the displacement of the position irradiated with the electron beam. In the method, ozone gas is introduced into the electron beam writing apparatus, and the ozone is caused to react with the contaminants to change the contaminants to volatile gas, thereby removing the contaminants.

In the method for introducing the ozone to remove the contaminants in the electron beam writing apparatus, while the electron beam writing apparatus is operating, the ozone gas can be injected into the apparatus to remove the contaminants. That is, a collision between the ozone and the electron beam is caused in the apparatus, and the ozone is separated into oxygen ($O_2$) and active oxygen (O*). For example, the separated active oxygen is caused to react with the contaminants adhering to the mask or the surface of each component in the apparatus, and the contaminants are evaporated as carbon monoxide gas (CO), carbon dioxide gas ($CO_2$), and water ($H_2O$), etc. In the conventional contaminant removing method, the electron beam writing apparatus can be kept clean without replacing the component, to which the contaminants adhere due to disassembly of the apparatus. That is, in-situ cleaning of the electron beam writing apparatus can be performed by the method.

However, for the conventional electron beam writing apparatus, the position irradiated with the electron beam is displaced by a slight change in the ozone gas in the apparatus. Therefore, in the conventional method, it is difficult to suppress degradation of the writing pattern to perform a highly accurate writing operation.

For example, for the conventional method in which the ozone gas is introduced into the electron beam writing apparatus, it is found that the position irradiated with the electron beam is displaced depending on a pressure of the gas introduced into the apparatus. Although control of the pressure of the introduced gas is demanded with high accuracy, it is difficult to control the pressure in the conventional control technology using a valve is used. It is also found that the change in irradiated position due to the pressure of the introduced gas depends on a measuring method, specifically based on whether an irradiated target is a calibration substrate or the mask. In this case, the irradiated position during adjustment differs from the irradiated position during the actual writing operation, and the writing operation is barely performed at the desired irradiated position.

The displacement of the position irradiated with the electron beam due to the introduction of the ozone gas is attributed to the fact that the ozone gas introduced into the electron beam writing apparatus or a decomposition product of the ozone gas is ionized by the irradiation with the electron beam and therefore a positive ion is formed by the ionization. That is, the positive ion formed from the ozone gas remains on an optical path of the electron beam to form the electric field around the optical path, thereby exerting a lens effect.

Accordingly, there is a demand for the electron beam writing apparatus and the electron beam writing method, in which a variation of an influence caused by the ozone introduction can be suppressed to a lower level to stably perform the highly accurate writing operation while the in-situ cleaning is performed by the ozone introduction to eliminate the influence of the contaminants. The demand is not limited to only the electron beam writing apparatus and the electron beam writing method, but also a charged particle beam writing apparatus and a charged particle beam writing method in which other charged particle beams such as an ion beam are used. That is, there is the demand for the charged particle beam writing apparatus and the charged particle beam writing method, in which the variation of the influence caused by the ozone introduction can be suppressed to a lower level to stably perform the highly accurate writing operation while the in-situ cleaning is performed by the ozone introduction to eliminate the influence of the contaminants.

An object of the present invention is to provide a charged particle beam writing apparatus that stably performs a highly accurate writing operation while suppressing the variation of the influence caused by the ozone introduction.

Another object of the present invention is to provide a charged particle beam writing method that stably performs a highly accurate writing operation while suppressing the variation of the influence caused by the ozone introduction.

Other challenges and advantages of the present invention are apparent from the following description.

SUMMARY OF THE INVENTION

According to one aspect of the present invention, a charged particle beam writing apparatus includes a stage, an electron optical column, an ozone introducing mechanism, a first voltage supply unit, and a second voltage supply unit. The stage is configured to mount a sample thereon. The electron optical column includes a charged particle gun and a deflector. The charged particle gun is configured to emit a charged particle beam. The deflector includes a plurality of deflecting electrodes configured to control a path of the charged particle beam. The ozone introducing mechanism is configured to introduce ozone into the electron optical column. The first voltage supply unit is configured to apply a deflection voltage to the plurality of deflecting electrodes to deflect the charged particle beam. The second voltage supply unit is configured to apply an identical negative DC voltage to the plurality of deflecting electrodes. A negative voltage in which the deflection voltage and the negative DC voltage are added to each other is applied to the plurality of deflecting electrodes while the sample is irradiated by the charged particle beam.

According to another aspect of the present invention, a charged particle beam writing method includes introducing ozone into a charged particle beam writing apparatus in which a charged particle gun and a deflector are arranged. The charged particle gun emits a charged particle beam. The deflector is constructed with a plurality of deflecting electrodes. A sample is irradiated with a charged particle beam in order to align a position irradiated with the charged particle beam. An identical negative DC voltage is applied to the plurality of deflecting electrodes of the deflector to measure the position irradiated with the charged particle beam. A deflection voltage is applied to the plurality of deflecting electrodes of the deflector to confirm that the position to be irradiated by the charged particle beam is the desired position. A negative voltage, in which the deflection voltage and the negative DC voltage are added to each other, is applied to the plurality of deflecting electrodes of the deflector while the ozone is introduced into the charged particle beam writing apparatus, and the sample is irradiated with the charged particle beam.

DETAILED DESCRIPTION OF THE EMBODIMENT

First Embodiment

The construction using an electron beam as one example of a charged particle beam will be described in the following first embodiment of the present invention. That is, an electron beam writing apparatus including an electron gun as one example of a charged particle gun will be described as one example of a charged particle beam writing apparatus. However, a charged particle beam is not limited to an electron beam, it might be for example, an ion beam, or another charged particle beam.

Figure 1:
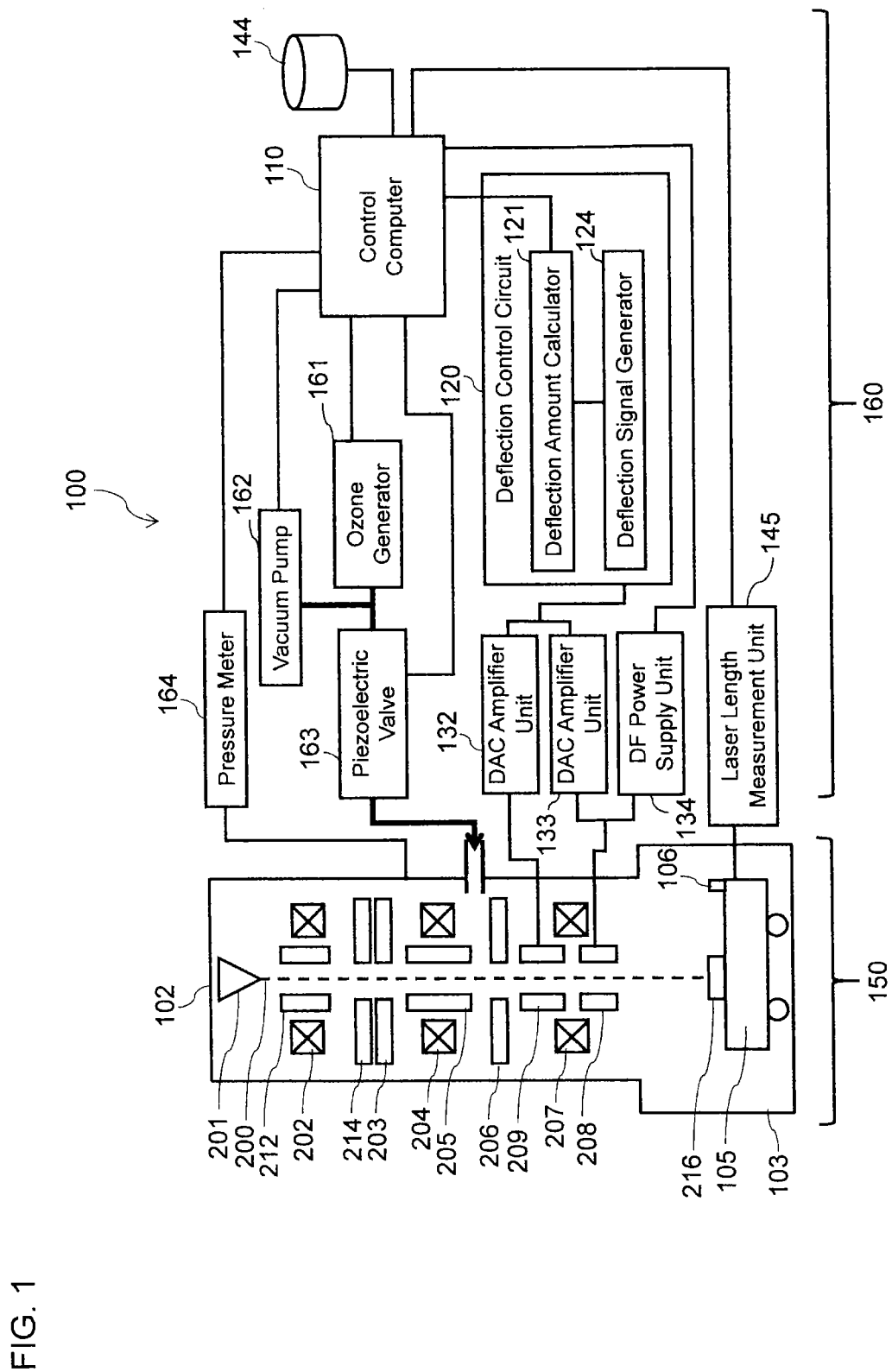
FIG. 1 is a schematic diagram of an electron beam writing apparatus according to the first embodiment of the present invention.

FIG. 1 is a schematic diagram of an electron beam writing apparatus according to the first embodiment of the present invention.

In FIG. 1, an electron beam writing apparatus 100 is one example of a variable shape electron beam writing apparatus including a writing unit 150 and a control unit 160.

The writing unit 150 includes an electron optical column 102 and a writing chamber 103.

The electron optical column 102 is kept at a vacuum atmosphere. The electron optical column 102 includes an electron gun 201, an illumination lens 202, a blanking deflector 212, a blanking aperture 214, a first shaping aperture 203, a projection lens 204, a shaping deflector 205, a second shaping aperture 206, an objective lens 207, a main deflector 208, a sub-deflector 209.

The illumination lens 202, the projection lens 204, and the objective lens 207 are all electromagnetic lenses for focusing an electron beam and adjusting a focus position (irradiation position) by changing excitation. As shown in FIG. 1, these lenses are aligned in an axial direction of the electron beam 200 from the upstream position in which the electron gun 201 is provided to the downstream position in which the stage 105, to be described later, is provided. These electromagnetic lenses consist of excitation coils (not shown).

The electron beam 200 emitted from the electron gun 201 is illuminated to the first shaping aperture 203 through the illumination lens 202 which shapes the electron beam 200 into, for example, a rectangular form. The electron beam 200 is then projected on the second shaping aperture 206 by the projection lens 204. The shaping deflector 205 controls the position of the image of the first shaping aperture on the second shaping aperture 206, thereby changing the shape and size of the electron beam. The irradiation position of the electron beam 200 passing through the second shaping aperture 206 is adjusted by the objective lens 207, and then deflected by the main deflector 208 and the sub-deflector 209. In the electron beam writing apparatus 100 of the first embodiment, as described later, the main deflector 208 is one that is also used as an electrostatic lens, that is, correction of the position irradiated with the electron beam 200, namely, second-stage alignment of the irradiated position is performed using the main deflector 208, and the sample 216 placed on the writing chamber 103 is irradiated with the electron beam 200.

In the electron beam writing apparatus 100 according to the first embodiment of the present invention, a shield plate (not shown) can be provided in the lower part of the electron optical column 102, specifically between the boundary of the electron optical column 102 and the writing chamber 103. Reflected electrons or secondary electrons which are generated according to the irradiation to the sample 216 by the electron beam 200, and then enter the electron optical column 102, that cause variation to the irradiation position of the electron beam, can be reduced by providing the shield plate.

In FIG. 1, a stage 105 is positioned in the writing chamber 103. The stage 105 is driven along the X-direction (right and left direction of FIG. 1), Y-direction (front and back direction of FIG. 1), and Z-direction (up and down direction of FIG. 1) by a control computer (to be described later).

The sample 216 to be written is mounted on the stage 105. When a mask is used as the sample 216, the mask has, for example, a mask substrate consisting of quartz or a similar material, a chromium (Cr) film or a molybdenum silicon (MoSi) film as a light shielding film on the mask substrate, and a resist film on the light shielding film. Next, the resist film is irradiated by the electron beam 200 to write a predetermined pattern. The mask includes a mask blank in which the pattern is not formed.

A reflective mirror 106 for measuring the position of the stage using a laser is arranged at a different position to the sample 216 positioned on the XY stage 105. The reflective mirror 106 reflects the laser emitted from a laser length measurement unit 145, then the laser length measurement unit 145 receives the laser reflected by the reflective mirror 106. Thereby, the position of the stage 105 is determined by this illuminated and reflected light. The data of the position is then output to the control computer 110.

A Z sensor (not shown) for detecting the position of the sample 216 along the height direction (Z direction) can be provided at the top of the writing chamber 103. The Z sensor consists of a combination of a light emitting unit and a light receiving unit. The light emitted from the light emitting unit is reflected on the surface of the sample 216, the light reflected is then received by the light receiving unit. The height of the sample 216 is thereby measured.

The blanking deflector 212, the shaping deflector 205, the main deflector 208, and the sub-deflector 209 include deflecting electrodes for controlling an electron beam path and the irradiation position of the electron beam.

The blanking deflector 212 provided in the upper portion of the electron optical column 102 consists of a plurality of deflecting electrodes, for example, two or four electrodes. Each of the shaping deflectors 205 provided at an under portion of the electron optical column 102 consists of a plurality of electrodes, for example, four or eight electrodes. Every electrode of each deflector is connected to at least one DAC (Digital Analog Converter) unit.

The main deflector 208 and the sub-deflector 209 consist of a plurality of deflecting electrodes, for example, four or eight electrodes. The electrodes of the main deflector 208 and the sub-deflector 209 are individually connected to at least one DAC (Digital Analog Converter) amplifier units 132 and 133, as a first voltage supplying unit.

The control unit 160 includes the control computer 110, a deflection control circuit 120, the DAC amplifier units 132 and 133, the DF power supply unit 134, an ozone generator 161, a vacuum pump 162, a piezoelectric valve 163, a pressure meter 164, and a magnetic disk device as a storage device 144.

The control computer 110, the deflection control circuit 120 and the storage device 144 are connected to each other through buses (not shown). The deflection control circuit 120 and the DAC amplifier units 132 and 133 are also connected to each other through buses (not shown).

The DAC amplifier unit 132 is connected to the sub-deflector 209. The DAC amplifier unit 133 is connected to the main deflector 208.

The deflection control circuit 120 transmits the digital signals for controlling the DAC amplifier units (132, 133) connected to the main deflector 208 and the sub-deflector 209, and the above-mentioned DAC amplifier units respectively. The digital signals are then converted into analog signals. The DAC amplifier units (130 to 133) amplify the converted analog signals and transmit the amplified converted analog signals as deflection voltage to the corresponding deflectors, respectively. The electron beam 200 is then deflected to the desired position.

The ozone generator 161 of the control unit 160 is connected to the electron optical column 102 by piping so as to introduce the ozone into the electron optical column 102. The ozone generator 161 can generate the high-purity ozone with a high pressure. For example, the ozone generator 161 can generate the high-purity ozone with a pressure of about 1000 Pa.

In the control unit 160, the piezoelectric valve 163 is provided on piping between the ozone generator 161 and the electron optical column 102. The piezoelectric valve 163 is driven by a piezoelectric actuator, and can control a flow rate (the pressure of the introduced gas) of the ozone gas introduced from the ozone generator 161 into the electron optical column 102.

For example, a diffusion pump is used as the vacuum pump 162 of the control unit 160. In the control unit 160, the piping from the ozone generator 161 toward the piezoelectric valve 163 is branched in midstream, and the branched piping is connected to the vacuum pump 162. The vacuum pump 162 can discharge the ozone gas generated by the ozone generator 161 that is restricted by the piezoelectric valve 163 but not introduced into the electron optical column 102, that is, excess gas generated by the ozone generator 161 can be discharged.

The pressure meter 164 is connected to the electron optical column 102 so as to be able to measure a pressure in the writing unit 150, particularly the pressure in the electron optical column 102. On the other hand, the pressure meter 164 is also connected to the control computer 110 of the control unit 160 so as to be able to output pressure measurement data to the control computer 110.

The ozone generator 161, the vacuum pump 162, the piezoelectric valve 163, and the pressure meter 164 of the control unit 160 are connected to the control computer 110 to be able to be controlled by the control computer 110, and constitute an ozone introducing mechanism that introduces the ozone into the electron optical column 102.

Under the control of the control computer 110, for example, the ozone generator 161 generates the high-purity ozone with the pressure of about 1000 Pa. The ozone gas is introduced into the electron optical column 102 of the writing unit 150 while the flow rate of the ozone gas is adjusted by the piezoelectric valve 163. According to the present embodiment, the electron beam writing apparatus 100 is preferably configured so that the ozone gas introduced into the electron optical column 102 contacts at least one of the main deflector 208, and the sub-deflector 209. As shown in FIG. 1, as to the introduction of the ozone gas into the electron optical column 102, for example, preferably the ozone gas is introduced toward a region between the shaping deflector 205 of the second shaping aperture 206 of the electron optical column 102. Because a portion below the shaping deflector 205 is a sufficiently small area, after the ozone gas enters the electron optical column 102 the ozone gas can diffuse to a downstream side on which the sub-deflector 209 and the main deflector 208 are provided. Furthermore, the electron beam writing apparatus 100 may also be configured so that the ozone gas introduced into the electron optical column 102 contacts at least one of the other deflectors, for example, the shaping deflector 205, or the blanking deflector 212.

At this point, in the control unit 160, the pressure in the electron optical column 102 is measured by the pressure meter 164, and the pressure measurement data is fed back to the piezoelectric valve 163 under the control of the control computer 110. The piezoelectric valve 163 adjusts an amount of introduced ozone gas such that the pressure in the electron optical column 102 falls within a range where the desirable electron beam 200 is formed, for example, a range of 10-4 Pa to 10-5 Pa. The ozone is introduced into the electron optical column 102 of the writing unit 150 while the ozone is adjusted to an extremely small amount by the control unit 160. The adjustment of the amount of introduced ozone can form the electron beam 200, and prevent the influence of the introduced ozone on the sample 216, for example, the degradation of a resist film of the sample 216. Additionally, the introduced ozone can effectively eliminate the influence of the contaminants.

Preferably the ozone generator 161 is controlled so as to always generate the ozone to circulate the ozone gas, thereby introducing the degradation-free high-purity ozone gas into the electron optical column 102. Therefore, in the control unit 160, the vacuum pump 162 is controlled to discharge the excess ozone gas restricted by the piezoelectric valve 163. As a result, the control unit 160 controls the ozone generator 161, the piezoelectric valve 163, and the vacuum pump 162 such that the generation state of the ozone is always maintained, and such that the necessary amount of ozone gas is supplied to the electron optical column 102.

In the configuration of the control unit 160, not only the contaminants in the electron optical column 102 but also the contaminants in the electron beam writing apparatus 100 can be removed by introducing the ozone using the ozone generator 161. That is, the ozone in the electron optical column 102 is caused to collide with the electron beam 200 to separate the ozone into oxygen and active oxygen. The separated active oxygen is caused to react with the contaminants adhering to the mask or a surface of each component in the apparatus, and the contaminants can be evaporated as, for example, carbon monoxide gas, carbon dioxide gas, and water.

In the electron beam writing apparatus 100, by performing the control using the vacuum pump 162, the piezoelectric valve 163, and the pressure meter 164 together with the ozone generator 161, the ozone gas is introduced into the operating apparatus to be able to remove the contaminants. Accordingly, in the electron beam writing apparatus 100, the inside of the apparatus can be kept clean without replacing the component, to which the contaminants adhere due to the disassembly of the apparatus. That is, the in-situ cleaning can be performed in the electron beam writing apparatus 100.

At this point, as described above, there is a risk of generating the displacement of the position irradiated with the electron beam due to the introduction of the ozone gas when the contaminants are removed in the operating apparatus by the ozone introduction. In the electron beam writing apparatus 100 of the first embodiment, the control unit 160 includes the DF power supply unit 134 as the second voltage supply unit, and the displacement of the position irradiated with the electron beam due to the introduction of the ozone gas can be reduced by applying a DC voltage to the main deflector 208 with the DF power supply unit 134.

More particularly, in the control unit 160, the DF power supply unit 134 is connected to the control computer 110 while connected to the main deflector 208. The control computer 110 controls the operation of the DF power supply unit 134, and the negative DC voltage can always be applied to the electrode constituting the main deflector 208. For example, the applied voltage can be set to the negative voltage ranging from 0 V to −350 V (however, not including 0 V). More specific description will be given below with reference to the drawings.

Figure 2:
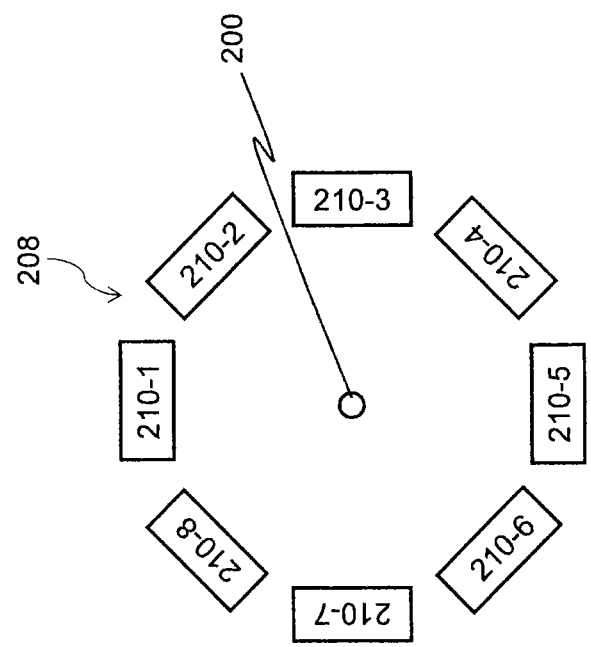
FIG. 2 is a schematic plane view illustrating an example of an arrangement of a main deflector and sub-deflector in the electron beam writing apparatus according to the first embodiment of the present invention.

FIG. 2 is a schematic plane view illustrating an example of an arrangement of a main deflector and sub-deflector in the electron beam writing apparatus according to the first embodiment of the present invention.

In the example of FIG. 2, the main deflector 208 is constructed with octupole deflecting electrodes 210-1 to 210-8. As described above, at least one DAC amplifier unit (not illustrated) is connected to each of the deflecting electrodes 210-1 to 210-8. As illustrated in FIG. 2, the octupole deflecting electrodes 210-1 to 210-8 are separately arranged so as to constitute sides of a regular octagon, and such that the electron beam 200 passes through a center of the regular octagon, that is, the main deflector 208 directs the path of the electron beam 200 through the center of the eight deflecting electrodes 210-1 to 210-8. The eight deflecting electrodes 210-1 to 210-8 are constructed with four pairs of deflecting electrodes facing each other, and an analog voltage is applied to the pair of deflecting electrodes from the corresponding DAC amplifier unit.

FIG. 2 illustrates the main deflector 208 constructed with the four pairs of (eight) deflecting electrodes by way of example. Alternatively, the main deflector 208 may be constructed with two pairs of (four) deflecting electrodes. Furthermore, other deflectors, for example, the sub-deflector 209, the shaping deflector 205, and the blanking deflector 212 may be used as the main deflector 208.

Figure 3:
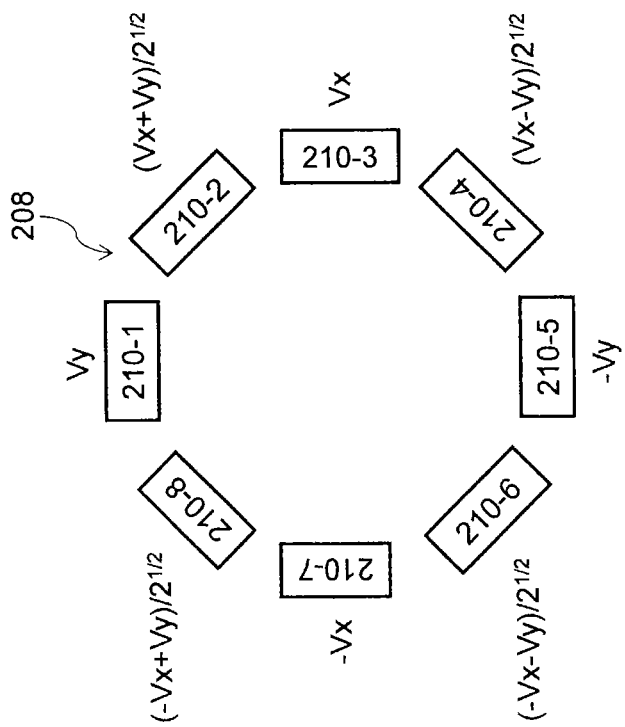
FIG. 3 is a schematic plane view illustrating the voltages applied from the DAC amplifier unit to the deflecting electrodes constituting the main deflector.

FIG. 3 is a schematic plane view illustrating the voltages applied from the DAC amplifier unit to the deflecting electrodes constituting the main deflector.

As illustrated in FIG. 3, a voltage "$V_y$" is applied from the DAC amplifier unit (not illustrated) to the deflecting electrode 210-1, a voltage "$-V_y$" is applied from the DAC amplifier unit to the deflecting electrode 210-5 that is of a counter electrode of the deflecting electrode 210-1. A voltage "$(V_x+V_y)/2^{1/2}$" is applied from the DAC amplifier unit to the deflecting electrode 210-2, and a voltage "$(-V_x-V_y)/2^{1/2}$" is applied from the DAC amplifier unit to the deflecting electrode 210-6 that is of the counter electrode of the deflecting electrode 210-2. A voltage "$V_x$" is applied from the DAC amplifier unit to the deflecting electrode 210-3, a voltage "$-V_x$" is applied from the DAC amplifier unit to the deflecting electrode 210-7 that is of the counter electrode of the deflecting electrode 210-3. A voltage "$(V_x-V_y)/2^{1/2}$" is applied from the DAC amplifier unit to the deflecting electrode 210-4, and a voltage "$(-V_x+V_y)/2^{1/2}$" is applied from the DAC amplifier unit to the deflecting electrode 210-8 that is of the counter electrode of the deflecting electrode 210-4. When the voltages are applied to the deflecting electrodes 210-1 to 210-8, the main deflector 208 can deflect the electron beam 200 to a desired position fixed by the voltage $V_x$ and the voltage $V_y$ from the center of the regular octagon.

Figure 4:
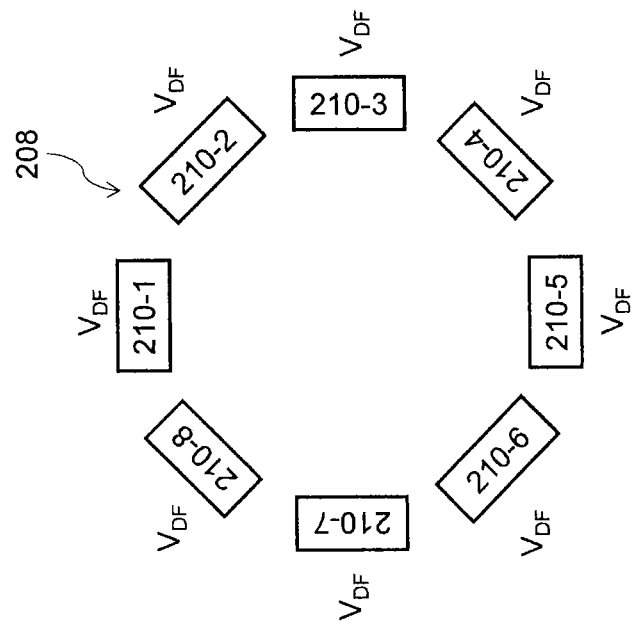
FIG. 4 is a schematic plane view illustrating a voltage which is applied from the DF power supply unit to the deflecting electrode.

FIG. 4 is a schematic plane view illustrating a voltage which is applied from the DF power supply unit to the deflecting electrode consisting the main deflector.

As illustrated in FIG. 4, the DF power supply unit (not illustrated) applies a voltage "$V_{DF}$" to each of the deflecting electrodes 210-1 to 210-8. As described above, the voltage $V_{DF}$ is the negative voltage ranging from 0 V to −350 V (however, not including 0 V). The main deflector 208 can attract the positive ion generated from the ozone gas onto the sides of the deflecting electrodes 210-1 to 210-8 by applying the voltage $V_{DF}$ to the deflecting electrodes 210-1 to 210-8.

Figure 5:
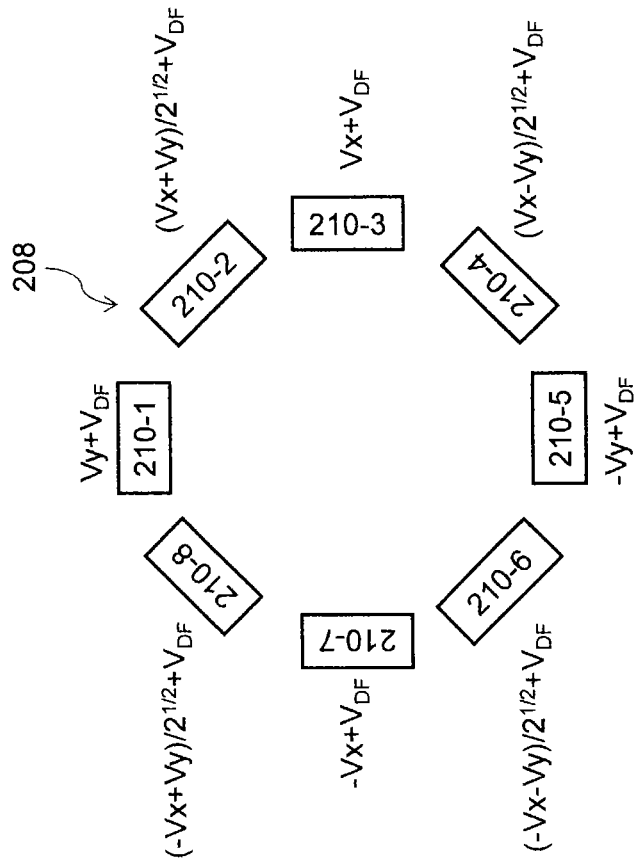
FIG. 5 is a schematic plane view illustrating a potential at each deflecting electrode of the main deflector.

FIG. 5 is a schematic plane view illustrating a potential at each deflecting electrode of the main deflector.

As illustrated in FIG. 5, when the DAC amplifier unit and the DF power supply unit apply the voltages to each deflecting electrode of the main deflector 208, the deflecting electrode 210-1 becomes the potential $V_y$ $V_{DF}$, the deflecting electrode 210-2 becomes the potential $(V_x+V_y)/2^{1/2}+V_{DF}$, the deflecting electrode 210-3 becomes the potential $V_x+V_{DF}$, the deflecting electrode 210-4 becomes the potential $(V_x-V_y)/2^{1/2}+V_{DF}$, the deflecting electrode 210-5 becomes the potential $-V_y+V_{DF}$, the deflecting electrode 210-6 becomes the potential $(-V_x-V_y)/2^{1/2}+V_{DF}$, the deflecting electrode 210-7 becomes the potential $-V_x+V_{DF}$, and the deflecting electrode 210-8 becomes the potential $(-V_x+V_y)/2^{1/2}$ $V_{DF}$.

For example, the voltage $V_x$ can be set to 50 V, the voltage $V_y$ can be set to 50 V, and the voltage $V_{DF}$ can be set to −250 V. In this case, the deflecting electrode 210-1 becomes the potential of −200 V, the deflecting electrode 210-2 becomes the potential of −179 V, the deflecting electrode 210-3 becomes the potential of −200 V, the deflecting electrode 210-4 becomes the potential of −250 V, the deflecting electrode 210-5 becomes the potential of −300 V, the deflecting electrode 210-6 becomes the potential of −320 V, the deflecting electrode 210-7 becomes the potential of −300 V, and the deflecting electrode 210-8 becomes the potential of −250 V. When the main deflector 208 deflects the electron beam 200, the negative voltages can always be applied to the deflecting electrodes 210-1 to 210-8 by setting the voltage $V_{DF}$ to a sufficiently large value relative to the voltages $V_x$ and $V_y$ set to 50 V, for example, by setting the voltage $V_{DF}$ to −250 V. As a result, the main deflector 208 can efficiently attract the positive ion generated from the ozone gas onto the sides of the deflecting electrodes 210-1 to 210-8. Preferably the negative DC voltage applied to the main deflector 208 by the DF power supply unit has an absolute value larger than the deflection voltage applied by the DAC amplifier unit.

Thus, the potentials in FIG. 5 are formed at the deflecting electrodes 210-1 to 210-8 of the main deflector 208 by applying the voltage with the DAC amplifier unit and the DF power supply unit, and the main deflector 208 can act as the deflector that deflects the electron beam.

Additionally, when the introduced ozone gas or the decomposition product of the ozone gas is ionized to form the positive ion by the irradiation with the electron beam 200, the main deflector 208 can attract the positive ion onto the sides of the deflecting electrodes 210-1 to 210-8. The positive ion generated from the ozone gas can be prevented from remaining on the optical path of the electron beam 200. The positive ion forms an electric field around the optical path to exert a lens effect, which allows the reduction of the displacement of the position irradiated with the electron beam.

At this point, the DF power supply unit in FIG. 4 applies the voltage $V_{DF}$, which allows the main deflector 208 to act as the electrostatic lens that adjusts the position irradiated with the electron beam 200. That is, the main deflector 208 includes the deflecting electrode that is also used as the electrostatic lens used in the alignment of the position irradiated with the electron beam 200.

Accordingly, in the electron beam writing apparatus 100 of the first embodiment, the main deflector 208 is used as the deflector that deflects the electron beam 200, and the main deflector 208 is also used as the electrostatic lens that adjusts the position irradiated with the electron beam 200. In the electron beam writing apparatus 100, preferably the voltages $V_{DF}$ applied to the deflecting electrodes 210-1 to 210-8 is fixed in consideration of compatibility between the positive ion attracting effect and optimization of the position irradiated with the electron beam 200. Therefore, in the electron beam writing apparatus 100, it is not necessary to separately provide the electrostatic lens, for example, between the main deflector 208 and the sample 216 in order to finely adjust the position irradiated with the electron beam 200, but an excellent irradiation alignment mechanism can be made with the small number of components.

In the electron beam writing apparatus 100, because the deflecting electrodes 210-1 to 210-8 of the main deflector 208 are also used as the electrostatic lens, an area of the electrodes constituting the electrostatic lens can be enlarged to, for example, about ten times compared with the case that electrostatic lens is separately provided. Accordingly, the main deflector 208 of the electron beam writing apparatus 100 can exert the high-efficiency lens effect and the high-efficiency positive ion attracting effect.

The electron beam writing apparatus 100 illustrates an example of the electron beam writing apparatus of the first embodiment, and various modifications of the electron beam writing apparatus of the first embodiment can be made.

For example, as illustrated in FIG. 1, the electron beam writing apparatus 100 includes the main deflector 208 and the sub-deflector 209 as the deflector, which deflects the electron beam 200 such that the sample 216 in the writing chamber 103 is irradiated, and the electron beam writing apparatus 100 has the structure in which the DF power supply unit 134 is connected to each deflecting electrode constituting the main deflector 208. At this point, in the electron beam writing apparatus 100 of the first embodiment, the DF power supply unit 134 may be connected to the sub-deflector 209 in the main deflector 208 and the sub-deflector 209. In this case, the sub-deflector 209 can act as the deflector that deflects the electron beam, and attract the positive ion from the introduced ozone. As a result, the positive ion generated from the ozone gas can be prevented from remaining on the optical path of the electron beam 200, and the displacement of the position irradiated with the electron beam due to the positive ion can be reduced.

The electron beam writing apparatus 100 of the first embodiment may include plural DF power supply units 134. In this case, at least one DF power supply unit 134 is connected to both the main deflector 208 and the sub-deflector 209. Each of the main deflector 208 and the sub-deflector 209 can act as the deflector that deflects the electron beam, and attract the positive ion from the introduced ozone. As a result, the main deflector 208 and the sub-deflector 209 can prevent the positive ion generated from the ozone gas from remaining on the optical path of the electron beam 200, and can reduce the displacement of the position irradiated with the electron beam due to the positive ion.

In the electron beam writing apparatus 100 of the first embodiment, only one kind of the deflector that deflects the electron beam 200 may be provided such that the sample 216 in the writing chamber 103 is irradiated. That is, the electron beam writing apparatus 100 of the first embodiment may include not the plural kinds of deflectors unlike the main deflector 208 and the sub-deflector 209, but only one kind of deflector. In this case, the DF power supply unit 134 is also connected to the one kind of deflector. As a result, the one kind of deflector can act as the deflector that deflects the electron beam, and attract the positive ion from the introduced ozone. As a result, the positive ion generated from the ozone gas can be prevented from remaining on the optical path of the electron beam 200, and the displacement of the position irradiated with the electron beam due to the positive ion can be reduced.

For example, as illustrated in FIG. 1, the electron beam writing apparatus 100 has the structure in which the two kinds of power supply units are connected to the main deflector 208 like the DAC amplifier unit 133 and the DF power supply unit 134. At this point, in the electron beam writing apparatus of the first embodiment, a control power supply unit having the functions of both the DAC amplifier unit 133 and the DF power supply unit 134 may be connected to the main deflector 208.

In this case, the control power supply unit is configured to be connected to the deflection control circuit 120. The deflection control circuit 120 outputs control digital signal to a control power supply unit in consideration of the deflection of the electron beam and the formation of the potential attracting the positive ion. The control power supply unit converts the digital signal into an analog signal, and amplifies the analog signal. Then, the amplified signal is output to the connected main deflector. Therefore, the main deflector of electron beam writing apparatus of the first embodiment can act as the deflector that deflects the electron beam, and attract the positive ion from the introduced ozone. As a result, the positive ion generated from the ozone gas can be prevented from remaining on the optical path of the electron beam 200, and the displacement of the position irradiated with the electron beam due to the positive ion can be reduced.

Figure 6:
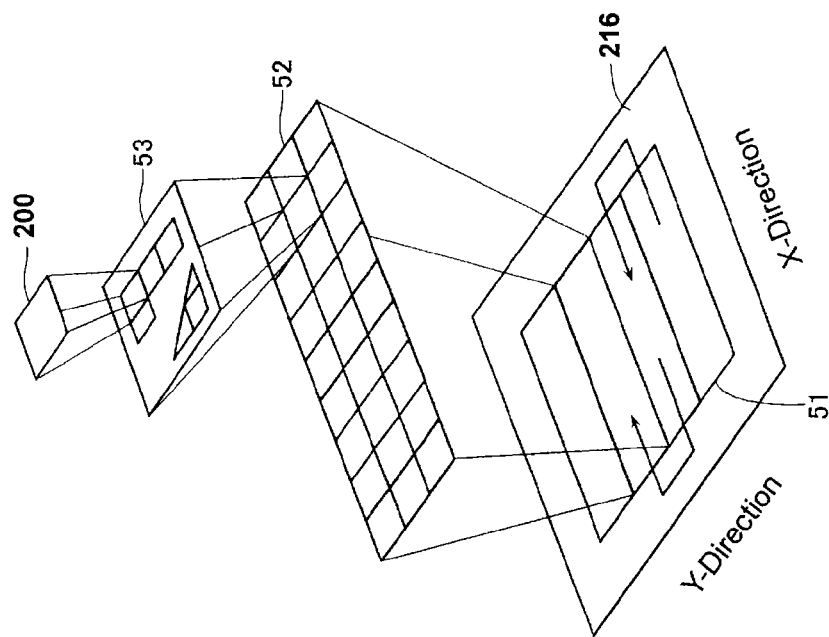
FIG. 6 is an illustrative diagram of a writing operation with an electron beam.

FIG. 6 illustrates an electron beam writing method.

As shown in FIG. 6, patterns 51 that will be written on the sample 216 are each divided into rectangular frame regions 52. The writing operation using an electron beam 200 is repeated for each frame region 52 while the stage 105 continuously moves in one direction, for example in the plus or minus X-direction. The frame region 52 is further divided into sub-deflection regions 53, and the electron beam 200 writes only necessary internal portions of each sub-deflection region 53. The frame region 52 is a rectangular writing region determined by deflection width of the main deflector 208, and the sub-deflection region 53 is a writing region determined by deflection width of the sub-deflector 209.

The determination of the standard position of the sub-deflection regions is done with the main deflector 208, the writing operation inside the sub-deflection regions 53 is controlled by sub-deflector 209. That is, the electron beam 200 is positioned in the specified sub-deflection regions 53 by the main deflector 208, determining the writing position inside sub-deflection regions 53 by the sub-deflector 209. Furthermore, the shaping deflector 205, and the first shaping aperture 203 and the second shaping aperture 206 for shaping the electron beam determine the shape and size of the electron beam 200. While the stage 105 is continuously moved in one direction a pattern is written in the inside of the sub-deflection region 53, and upon completion of the writing operation for the sub-deflection region 53, the writing operation of the next sub-deflection region 53 is performed. After all internal sub-deflection regions 53 of the frame region 52 have been written, the stage 105 is moved in steps in a direction (e.g., the plus or minus Y-direction) that is orthogonal to the continuous moving direction. Similar processing is then repeated for sequential writing operations of the frame region 52.

The sub-deflection regions are regions that are scanned and written by the electron beam 200, faster than scanning of main deflection regions by sub-deflector 209, as sub-deflection regions are usually the smallest writing regions. When the writing operation is performed inside the sub-deflection regions, the size and shape of shot are prepared according to the pattern shape, the shaping deflector 205 then forms the desired shot. Specifically, the electron beam 200 is irradiated from the electron gun 201, the first shaping aperture 203 forms the beam into a square shape, the electron beam is then projected to the second shaping aperture 206 by the shaping deflector 205, the 2nd aperture 18 changes the beam shape and size. After that, the electron beam 200 deflected by sub-deflector 209 and main deflector 208, is irradiated to the sample 216 which is mounted on stage 105.

At this point, the ozone exists on the optical path of the electron beam 200 due to the introduction of the ozone gas. The ozone generates the positive ion by the irradiation with the electron beam 200. The positive ions may form the electric field around the optical path to exert the lens effect, thereby displacing the position irradiated with the electron beam 200. However, in the electron beam writing apparatus 100 according to the first embodiment of the present invention, since negative electric potential is constantly given to the deflecting electrodes that the main deflector 208 is composed of, the reflected electrons can attract positive ions. As a result, the positive ion generated from the ozone gas can be prevented from remaining on the optical path of the electron beam 200, and the displacement of the path of the electron beam 200 due to the influence of the electric field caused by the positive ion can be prevented. Therefore, a desired position on the sample 216 can be irradiated with the electron beam 200.

Second Embodiment

Next, a charged particle beam writing method according to the second embodiment of the present invention will be described and a construction using an electron beam as one example of a charged particle beam will be described. However, the charged particle beam is not limited to the electron beam and can be another beam using charged particle, for example an ion beam, etc.

In the electron beam writing method according to the second embodiment of the present invention, the desired pattern can be written on the sample 216 using the electron beam writing apparatus as shown in FIG. 1. As described above, in the electron beam writing apparatus 100, the main deflector 208 and the sub-deflector 209 are arranged in the electron optical column 102 in addition to the objective lens 207 that is of the electromagnetic lens. The ozone generator 161, the vacuum pump 162, the piezoelectric valve 163, and the pressure meter 164 constitute the ozone introducing mechanism that introduces the ozone into the electron optical column 102.

The DF power supply unit applies the voltage $V_{DF}$ as illustrated in FIG. 4, which allows the main deflector 208 of the electron beam writing apparatus 100 to act as the electrostatic lens that adjusts the position irradiated with the electron beam 200. That is, the main deflector 208 is configured to include the deflecting electrode that is also used as the electrostatic lens used in the alignment of the position irradiated with the electron beam 200.

Accordingly, in the electron beam writing apparatus 100, the objective lens 207 and the main deflector 208 are arranged in an axial direction of the electron beam 200 to align the position irradiated with the electron beam 200 in at least two stages.

Figure 7:
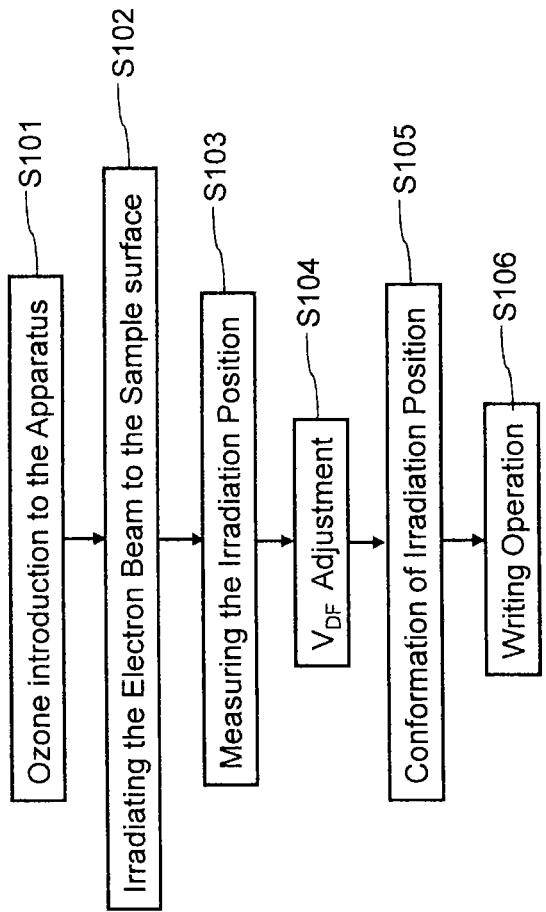
FIG. 7 is a flowchart illustrating the electron beam writing method according to the second embodiment of the present invention.

FIG. 7 is a flowchart illustrating the electron beam writing method according to the second embodiment of the present invention.

The electron beam writing method of the second embodiment includes a process in which the position irradiated with the electron beam 200 is aligned while the ozone is introduced into the apparatus and the voltage $V_{DF}$ applied to the main deflector 208 from the DF power supply unit 134 is adjusted and fixed (S101 to S105) and a writing process in which the voltage $V_{DF}$ fixed as a fixed value is applied to the main deflector 208 to perform the electron beam writing operation while the ozone is introduced (S106).

Specifically, referring to FIG. 7, an ozone introducing process of introducing the ozone into the electron beam writing apparatus 100 in FIG. 1 (S101), a beam irradiation process of emitting the electron beam 200 toward a writing surface of the sample 216 in order to align the irradiated position (S102), an irradiated position measuring process of measuring the irradiated position in order to align the irradiated position (S103), a $V_{DF}$ adjustment process of performing the adjustment such that the voltage $V_{DF}$ applied to each deflecting electrode of the main deflector 208 from the DF power supply unit 134 is sufficiently increased while the optimum irradiated position is achieved (S104), an irradiated position confirming process of applying the deflection voltage to the main deflector 208 from the DAC amplifier unit 133 to confirm that the position irradiated with the electron beam 200 is not displaced (S105), and the writing process (S106) of applying the fixed voltage $V_{DF}$ to the main deflector 208 to perform the electron beam writing operation on the sample 216 while the ozone is introduced are performed as main processes in the electron beam writing method of the second embodiment. Each process will be described below in detail.

In the electron beam writing method of the second embodiment, first the ozone is introduced into the electron beam writing apparatus 100 in the ozone introducing process (S101). Under the control of the control computer 110 of the electron beam writing apparatus 100, the ozone generator 161, the vacuum pump 162, the piezoelectric valve 163, and the pressure meter 164 are driven to introduce the ozone into the electron optical column 102. An amount of introduced ozone gas is adjusted such that a pressure in the electron optical column 102 falls within a desirable range where the electron beam 200 is formed, for example, a range of $10^{-4}$ Pa to $10^{-5}$ Pa.

In the electron beam writing method of the second embodiment, the ozone is continuously introduced until the writing process (S106). Accordingly, in the electron beam writing method of the second embodiment, in-situ cleaning can be performed by the introduction of the ozone, and an influence of the contaminants can be eliminated in the electron beam writing operation.

In the beam irradiation process (S102), the electron beam 200 is emitted from the electron optical column 102 toward the sample 216 on the stage 105 while the ozone is introduced into the apparatus. The writing surface of the sample 216 is irradiated with the electron beam 200 in order to measure the irradiated position.

For example, a calibration mark that is separately prepared in the writing surface of the sample 216 is used in the irradiated position measuring process (S103). The calibration mark is scanned with the electron beam 200 by deflecting the electron beam 200 or by moving the stage 105, thereby acquiring a beam profile of the calibration mark.

After coarse adjustment using the objective lens 207, the irradiated position is finely adjusted by adjusting the voltage $V_{DF}$ applied to each deflecting electrode of the main deflector 208 from the DF power supply unit 134. Then the calibration mark is irradiated with the electron beam 200. That is, the position irradiated with the electron beam 200 is aligned in the two stages, namely, a first stage in which the irradiated position is coarsely aligned using the objective lens 207 and a second stage in which the irradiated position is finely aligned by applying the negative DC voltage to the main deflector 208 that is also used as the electrostatic lens. A setting value of the objective lens 207 and the voltage $V_{DF}$ at the main deflector 208 are obtained for the beam profile having the minimum resolution in the obtained beam profiles.

In the $V_{DF}$ adjustment process (S104), the irradiated position is aligned while the position irradiated with the electron beam 200 is maintained, and an arrangement between a function of adjusting the irradiated position of the objective lens 207 and a function of finely adjusting the irradiated position of the main deflector to which the voltage $V_{DF}$ is applied is adjusted such that the voltage $V_{DF}$ is sufficiently increased relative to the deflection voltage in the main deflector 208. That is, the adjustment between the alignment of the position irradiated with the electron beam 200 in the first stage performed with the objective lens 207 and the alignment of the position irradiated with the electron beam 200 in the second stage performed with the main deflector 208 that is also used as the electrostatic lens is performed such that the negative DC voltage applied to the deflecting electrode of the main deflector 208 becomes larger while the position irradiated with the electron beam 200 is aligned, and the voltage $V_{DF}$ that is of the negative DC voltage is adjusted. As a result, the voltage $V_{DF}$ obtained in the irradiated position measuring process (S103) is adjusted to fix the post-adjustment optimum voltage $V_{DF}$.

In the electron beam writing method of the second embodiment, the voltage $V_{DF}$ that is of the optimum negative DC voltage is fixed, the negative potential can always be provided to the deflecting electrode constituting the main deflector 208 in the electron beam writing apparatus 100, and the deflecting electrode can attract the positive ion. As a result, the positive ion generated from the introduced ozone can be restrained from remaining on the optical path of the electron beam 200, and the displacement of a path of the electron beam 200 due to the influence of the electric field caused by the positive ion can be prevented.

In the irradiated position confirming process (S105), the adjusted optimum voltage $V_{DF}$ is used as the fixed value, and the DAC amplifier unit 133 applies the deflection voltage to the main deflector 208. Preferably, plural kinds of deflection voltages are applied to the main deflector 208 to confirm whether the displacement of the position irradiated with the electron beam 200 is generated by the application of each deflection voltage. When the displacement of the position irradiated with the electron beam 200 is generated by the application of the deflection voltage, the electron beam writing method returns to the previous process, for example, the $V_{DF}$ adjustment process (S104) to readjust the voltage $V_{DF}$, and whether the displacement of the position irradiated with the electron beam 200 is generated by the application of the deflection voltage is reconfirmed using the readjusted voltage $V_{DF}$. These processes are repeated until the displacement of the position irradiated with the electron beam 200 is not generated by the application of the deflection voltage. As a result, whether the displacement of the position irradiated with the electron beam 200 is not generated by the application of the deflection voltage is confirmed through the irradiated position confirming process, and the optimum voltage $V_{DF}$ for the main deflector 208 is fixed in the electron beam writing method of the second embodiment.

In the writing process (S106), after the condition for the introduction of the ozone gas into the apparatus and the post-adjustment optimum voltage $V_{DF}$ applied to the main deflector 208 are fixed through the above processes, the post-adjustment optimum voltage $V_{DF}$ is applied to the main deflector 208 while the ozone is introduced. Then the desired pattern is written in the sample 216 using the electron beam 200.

In order for the writing process to be performed, CAD data prepared by the designer (or user) is converted to design intermediate data in a hierarchical format such as OASIS. The design intermediate data includes data of the pattern formed on the sample 216 created for each layer. It should be noted that, generally, the electron beam writing apparatuses are not adapted to be able to directly read OASIS data. That is, each manufacturer of the electron beam writing apparatus uses different format data. Therefore, OASIS data is converted, for each layer, to format data in a format specific to the electron beam writing apparatus used, and this format data is input to the electron beam writing apparatus.

In FIG. 1, format data is entered into the electron beam writing apparatus 100 via the storage device 144.

The designed pattern includes pattern features each consisting of basic features such as rectangles and triangles. The storage device 144 stores feature data indicating the shape, size, and position of each pattern feature, specifically, information such as the coordinates (x, y) of the reference position of each feature, the length of its sides, and a shape code (or identifier) identifying the type of shape such as a rectangle or triangle.

Further, a group of pattern features, defined in an area of approximately a few tens of micrometers Square, is referred to as a "cluster" or "cell". It is common practice that the design pattern data is defined in a hierarchical structure using clusters or cells. A cluster (or cell), which contains a pattern feature or features, may be used alone or repeated at certain intervals. In the former case the coordinate positions of the cluster (or cell) on the sample 216 are specified, whereas in the latter case the coordinate positions of each copy of the cluster (or cell) are indicated together with a repetition instruction. Each cluster (or cell) is disposed in a strip-shaped region, referred to as a "frame" or "stripe", having a width of a few hundreds of micrometers and a length of approximately 100 mm that corresponds to the length of the sample 216 in the X or Y direction.

The division of the pattern into pattern elements is performed based on the maximum shot size determined by the size of the electron beam 200, and the coordinate positions, size, and exposure time of each divided shot are also set. Then, writing data is generated so that each shot is shaped in accordance with the shape or size of a pattern element to be written. The writing data is divided into strip-like frame regions (main deflection regions), and each of the frame regions is further divided into sub-deflection regions. That is, the writing data of the entire wafer has a hierarchical data structure including the data of a plurality of strip-like frames whose size corresponds to the size of the main deflection region and the data of a plurality of sub-deflection region units, smaller in size than the main deflection region, in the frame.

In FIG. 1, write data read from the storage device 144 by the control computer 110, is processed through a plurality of steps, thereby generating shot data. The shot data is transmitted to a deflection amount calculator 121 of the deflection control circuit 120.

The deflection amount calculator 121 receives the shot data, the positional information of the stage 105, and the height information of the sample 216 sent from the control computer 110. Then, the deflection amount calculator 121 calculates respective deflection amounts in the blanking deflector 212, the shaping deflector 205, the sub-deflector 209, and the main deflector 208. The respective deflection amounts thus obtained are sent to a deflection signal generator 124.

The deflection signal generator 124 generates a deflection signal to be applied to each electrode of the blanking deflector 212, the shaping deflector 205, the sub-deflector 209, and the main deflector 208. Each deflection signal is outputted to each of the corresponding DAC amplifier units, including the DAC amplifier units 132 and 133, etc.

After each DAC amplifier unit including the DAC amplifier unit 132 connecting to the sub-deflector 209, and the DAC amplifier unit 133 connecting to the main deflector 208, convert deflection signals, that are digital signals outputted from the deflection signal generator 124 into analog signals, respectively, they then amplify the analog signals to produce deflection voltages. The deflection voltages produced are applied to the corresponding deflectors 212, 205, 209, and 208. For example, the deflection voltage is applied to the main deflector 208 as shown in FIG. 3.

In the electron optical column 102 in which the ozone gas is introduced, the electron beam 200 emitted from the electron gun 201 illuminates the first shaping aperture 203 through the illumination lens 202. This shapes the electron beam 200 into a rectangle, for example. Subsequently, the electron beam 200 is projected to the second shaping aperture 206 by the projection lens 204. The deflection voltage applied to the shaping deflector 205 determines the projection position in the second shaping aperture 206.

It should be noted that the blanking aperture 214 and the blanking deflector 212 serve to control irradiation to the sample 216 with the electron beam 200.

The electron beam 200 passing through the second shaping aperture 206 is shaped into the desired shape and size. Next, the position irradiated with the electron beam 200 is adjusted by the optical lens 207, and then deflected by the main deflector 208 and the sub-deflector 209. That is, the electron beam 200 is deflected to the position corresponding to deflection voltage applied to the main deflector 208 and the sub-deflector 209, respectively. The main deflector 208 positions the electron beam 200 in the sub-deflection region on the sample 216. The sub-deflector 209 positions the electron beam 200 at a writing position in the sub-deflection region in each graphic unit for the writing operation.

At this point, for the electron beam 200 that is deflected by the main deflector 208 and the sub-deflector 209, the irradiated position is finely adjusted on the sample 216 by the main deflector 208 connected to the DF power supply unit 134. That is, the voltage $V_{DF}$ that is of the negative DC voltage is applied to the main deflector 208 from the DF power supply unit 134 (not illustrated in FIG. 4) as illustrated in FIG. 4, thereby forming the potential as illustrated in FIG. 5. Accordingly, the main deflector 208 acts as not only the deflector but also the electrostatic lens, and the main deflector 208 finely adjusts the position irradiated with the electron beam 200, and aligns the irradiated position together with the objective lens 207.

The ozone exists on the optical path of the electron beam 200 due to the introduction of the ozone gas. The ozone is irradiated with the electron beam 200 to generate the positive ion. The positive ion forms the electric field around the optical path to exert the lens effect, and may displace the position irradiated with the electron beam 200.

On the other hand, in the electron beam writing apparatus 100 of the second embodiment, the DF power supply unit 134 always provides the negative potential to the deflecting electrode constituting the main deflector 208. Therefore, the main deflector 208 can attract the positive ion generated on the optical path of the electron beam 200 using the deflecting electrode while irradiating the position with the electron beam 200. As a result, the positive ion generated from the ozone gas can be prevented from remaining on the optical path of the electron beam 200, and the displacement of the path of the electron beam 200 due to the influence of the electric field caused by the positive ion can be prevented.

Accordingly, in the electron beam writing method of the second embodiment, the influence of the ozone on the positive ion is eliminated, and the desired position on the sample 216 can optimally be irradiated with the electron beam 200. As a result, in the electron beam writing method of the second embodiment, the in-situ cleaning can be performed by the introduction of the ozone into the apparatus to eliminate the influence of the contaminants, and the displacement of the irradiated position due to the influence of the introduced ozone can be suppressed to perform the high-accuracy electron beam writing operation with high stability.

The present invention is not limited to the above embodiments and may be modified in various forms without departing from the scope of the invention.

What is claimed is:

1. A charged particle beam writing apparatus comprising:
a stage configured to mount a sample placed thereon;
an electron optical column including a charged particle gun and a deflector,
wherein the charged particle gun is configured to emit a charged particle beam, and
the deflector includes a plurality of deflecting electrodes configured to control a path of the charged particle beam;
an ozone introducing mechanism configured to introduce ozone into the electron optical column;
a first voltage supply unit configured to apply a deflection voltage to the plurality of deflecting electrodes to deflect the charged particle beam; and
a second voltage supply unit configured to apply an identical negative DC voltage to the plurality of deflecting electrodes,
wherein a negative voltage in which the deflection voltage and the negative DC voltage are added to each other is applied to the plurality of deflecting electrodes while the sample is irradiated by the charged particle beam.

2. The charged particle beam writing apparatus according to claim 1, wherein the deflector includes four or eight deflecting electrodes.

3. The charged particle beam writing apparatus according to claim 1, wherein the deflector includes eight deflecting electrodes that are separately arranged so as to form a regular octagon, the deflector directing the path of the charged particle beam through the center of the eight deflecting electrodes.

4. The charged particle beam writing apparatus according to claim 1, wherein the deflecting electrode is also used as an electrostatic lens by applying the negative DC voltage to the deflecting electrode by the second voltage supply unit.

5. The charged particle beam writing apparatus according to claim 1, wherein the negative DC voltage applied to the deflecting electrode by the second voltage supply unit has an absolute value larger than that of the deflection voltage applied by the first voltage supply unit.

6. The charged particle beam writing apparatus according to claim 1, wherein the negative DC voltage applied to the deflecting electrode by the second voltage supply unit is a negative voltage within a range of a voltage smaller than 0 V and a voltage equal to or larger than −350 V.

7. The charged particle beam writing apparatus according to claim 1, wherein the ozone introducing mechanism includes:
- an ozone generator configured to generate the ozone;
- a valve configured to control a flow rate of the ozone introduced from the ozone generator into the electron optical column;
- a pressure meter configured to measure a pressure in the electron optical column; and
- a pump configured to discharge the excess ozone generated by the ozone generator.

8. The charged particle beam writing apparatus according to claim 1, wherein the charged particle beam writing apparatus is configured so that the ozone introduced into the electron optical column contacts the deflector.

9. A charged particle beam writing method comprising:
- introducing ozone into a charged particle beam writing apparatus in which a charged particle gun and a deflector are arranged, the charged particle gun emitting a charged particle beam, the deflector constructed with a plurality of deflecting electrodes;
- irradiating a sample with a charged particle beam in order to align a position irradiated with the charged particle beam;
- applying an identical negative DC voltage to the plurality of deflecting electrodes of the deflector to measure the position irradiated with the charged particle beam;
- applying a deflection voltage to the plurality of deflecting electrodes of the deflector to confirm that the position to be irradiated by the charged particle beam is the desired position; and
- applying a negative voltage, in which the deflection voltage and the negative DC voltage are added to each other, to the plurality of deflecting electrodes of the deflector while the ozone is introduced into the charged particle beam writing apparatus, and irradiating the sample with the charged particle beam.

10. The charged particle beam writing method according to claim 9, wherein
- the electromagnetic lens is arranged in the charged particle beam writing apparatus to align the position irradiated with the charged particle beam, and
- the method further comprising, before the process of confirming that the position to be irradiated by the charged particle beam is the desired position, adjusting the negative DC voltage applied to the plurality of deflecting electrodes of the deflector so that the negative DC voltage becomes larger while maintaining the desired position irradiated with the charged particle beam using an electromagnetic lens and the deflector.

11. The charged particle beam writing method according to claim 9, wherein the ozone introduced into the charged particle beam writing apparatus is diffused onto a side on which the deflector exists.

12. The charged particle beam writing method according to claim 9, wherein the negative DC voltage applied to the deflecting electrode has an absolute value larger than that of the deflection voltage applied to the deflecting electrode, while the sample is irradiated with the charged particle beam.

13. The charged particle beam writing method according to claim 9, wherein the negative DC voltage applied to the deflecting electrode is a negative voltage within a range of a voltage smaller than 0 V and a voltage equal to or larger than −350 V, while the sample is irradiated with the charged particle beam.

* * * * *